United States Patent
Kitagawa et al.

(10) Patent No.: US 9,799,412 B2
(45) Date of Patent: Oct. 24, 2017

(54) MEMORY HAVING A PLURALITY OF MEMORY CELLS AND A PLURALITY OF WORD LINES

(71) Applicant: Sony Semiconductor Solutions Corporation, Kanagawa OT (JP)

(72) Inventors: Makoto Kitagawa, Boise, ID (US); Yogesh Luthra, Boise, ID (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/502,077

(22) Filed: Sep. 30, 2014

(65) Prior Publication Data

US 2016/0093402 A1    Mar. 31, 2016

(51) Int. Cl.
G11C 11/00 (2006.01)
G11C 29/00 (2006.01)
G11C 13/00 (2006.01)

(52) U.S. Cl.
CPC ......... *G11C 29/70* (2013.01); *G11C 13/0069* (2013.01); *G11C 29/80* (2013.01)

(58) Field of Classification Search
USPC .... 365/148, 163, 200, 158, 171, 173, 225.7, 365/230.03, 230.06
See application file for complete search history.

(56) References Cited

U.S. PATENT DOCUMENTS

| | | | |
|---|---|---|---|
| 5,519,657 A | 5/1996 | Arimoto | |
| 5,703,817 A * | 12/1997 | Shiratake | G11C 29/44 365/200 |
| 5,901,081 A * | 5/1999 | Lahiri | G11C 8/08 365/200 |
| 6,018,483 A * | 1/2000 | Poechmueller | G11C 29/80 365/200 |
| 6,052,318 A * | 4/2000 | Kirihata | G11C 29/816 365/200 |
| 6,590,815 B2 * | 7/2003 | Mine | G11C 11/406 365/200 |
| 6,671,213 B2 * | 12/2003 | Ohtani | G11C 29/789 365/200 |
| 7,106,643 B2 * | 9/2006 | Horiguchi | G11C 29/785 365/200 |
| 7,257,039 B2 * | 8/2007 | Bedeschi | G11C 13/0004 365/200 |
| 7,889,548 B2 * | 2/2011 | Jeong | G11C 13/0004 365/148 |
| 8,565,004 B2 * | 10/2013 | Iijima | G11C 11/5685 365/148 |

(Continued)

OTHER PUBLICATIONS

Aratani et al., A Novel Resistance Memory with High Scalability and Nanosecond Switching. IEEE Electron Devices Meeting (IEDM) 2007. 783-6.

(Continued)

*Primary Examiner* — Vu Le
(74) *Attorney, Agent, or Firm* — Sheridan Ross P.C.

(57) ABSTRACT

A memory includes a plurality of replacement word lines interspersed among the plurality of word lines. The memory also includes a word line control circuit configured to apply different voltages to different word lines of the plurality of word lines based on positions of the word lines, and to replace a defective word line of the plurality of word lines with a replacement word line.

17 Claims, 7 Drawing Sheets

(56) References Cited

U.S. PATENT DOCUMENTS

| | | | | |
|---|---|---|---|---|
| 8,605,520 B2* | 12/2013 | Pu | ............................ | G11C 7/06 |
| | | | | 365/158 |
| 8,730,744 B2* | 5/2014 | Kawakubo | ............... | G11C 8/08 |
| | | | | 365/200 |
| 8,730,754 B2* | 5/2014 | Barkley | ................. | G11C 5/025 |
| | | | | 365/230.03 |
| 8,817,530 B2* | 8/2014 | Alam | ................... | G11C 11/1673 |
| | | | | 365/148 |
| 8,848,422 B2* | 9/2014 | Tomotani | ............. | G11C 13/004 |
| | | | | 365/148 |
| 8,897,063 B2* | 11/2014 | Jurasek | ................ | G11C 13/004 |
| | | | | 365/148 |
| 8,913,450 B2* | 12/2014 | Kim | ....................... | G11C 16/20 |
| | | | | 365/200 |
| 9,007,811 B1* | 4/2015 | Andre | ...................... | G11C 8/08 |
| | | | | 365/148 |
| 9,269,432 B2* | 2/2016 | Faraoni | ............. | G11C 13/0064 |
| 2006/0109716 A1 | 5/2006 | Kim et al. | | |
| 2008/0316845 A1 | 12/2008 | Wang et al. | | |
| 2012/0081964 A1 | 4/2012 | Li | | |

OTHER PUBLICATIONS

Fackenthal et al., A 16Gb ReRAM with 200MB/s Write and 1GB/s Read in 27nm Technology. 2014 IEEE International Solid-State Circuits Conference / Session 19 / Nonvolatile Memory Solutions / 19.7. Feb. 12, 2014;:338-40.

Otsuka et al., A 4Mb Conductive-Bridge Resistive Memory with 2.3GB/s Read-Throughput and 216MB/s Program-Throughput. 2011 IEEE International Solid-State Circuits Conference / Session 11 / Non-Volatile Memory Solutions / 11.7. Feb. 22, 2011;:210-11.

International Search Report for International (PCT) Patent Application No. PCT/JP2015/004776 dated Dec. 18, 2015, 5 pages.

\* cited by examiner

MEMORY HAVING A PLURALITY OF MEMORY CELLS AND A PLURALITY OF WORD LINES

BACKGROUND

Technical Field

The techniques described herein relate to memories for storing data, and in particular to the inclusion of replacement word lines that can replace one or more defective word lines in a manner that is compatible with an address-based voltage compensation technique.

Discussion of the Related Art

Memories used for storing data typically have an array of memory cells arranged in rows and columns. Word lines extend along the rows and bit lines extend along the columns to connect to the memory cells. Various types of memory technologies exist, including various types of volatile and non-volatile memory.

SUMMARY

Some embodiments relate to a memory that includes a plurality of memory cells, a plurality of bit lines connected to the plurality of memory cells, a plurality of word lines connected to the plurality of memory cells, and a plurality of replacement word lines interspersed among the plurality of word lines. The memory also includes a word line control circuit configured to apply different voltages to respective word lines of the plurality of word lines based on positions of the respective word lines. The word line control circuit is configured to apply the different voltages to the respective word lines during an operation performed on memory cells of the plurality of memory cells. The memory cells are connected to the respective word lines. The word line control circuit is configured to replace a defective word line of the plurality of word lines with a replacement word line of the plurality of replacement word lines.

Some embodiments relate to a method of operating a memory that includes a plurality of memory cells, a plurality of bit lines connected to the plurality of memory cells, a plurality of word lines connected to the plurality of memory cells, a plurality of replacement word lines interspersed among the plurality of word lines, and a word line control circuit. The method includes applying, by the word line control circuit, different voltages to respective word lines of the plurality of word lines based on positions of the respective word lines during an operation performed on memory cells of the plurality of memory cells. The memory cells are connected to the respective word lines. The method also includes replacing a defective word line of the plurality of word lines with a replacement word line of the plurality of replacement word lines.

Some embodiments relate to a memory that includes a plurality of memory cells, a plurality of bit lines connected to the plurality of memory cells, and a plurality of word lines connected to the plurality of memory cells. The plurality of word lines includes a first set of word lines, a second set of word lines and a third set of word lines. The memory also includes a plurality of replacement word lines including at least one first replacement word line between the first set of word lines and the second set of word lines, and at least one second replacement word line between the second set of word lines and the third set of word lines. The memory further includes a word line control circuit configured to apply different voltages to respective word lines of the plurality of word lines based on positions of the respective word lines. The word line control circuit is configured to apply the different voltages to the respective word lines during an operation performed on memory cells of the plurality of memory cells. The memory cells are connected to the respective word lines. The word line control circuit is configured to replace a defective word line of the first set or the second set with a replacement word line of the at least one first replacement word line.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing.

DETAILED DESCRIPTION

In some embodiments, a memory may include a plurality of replacement word lines that are interspersed throughout the memory between the word lines. If a word line is defective and needs to be replaced, in can be replaced with a nearby replacement word line. In some embodiments, the defective word line can be replaced without needing to change an address-based voltage compensation scheme, as will be described.

Figure 1:
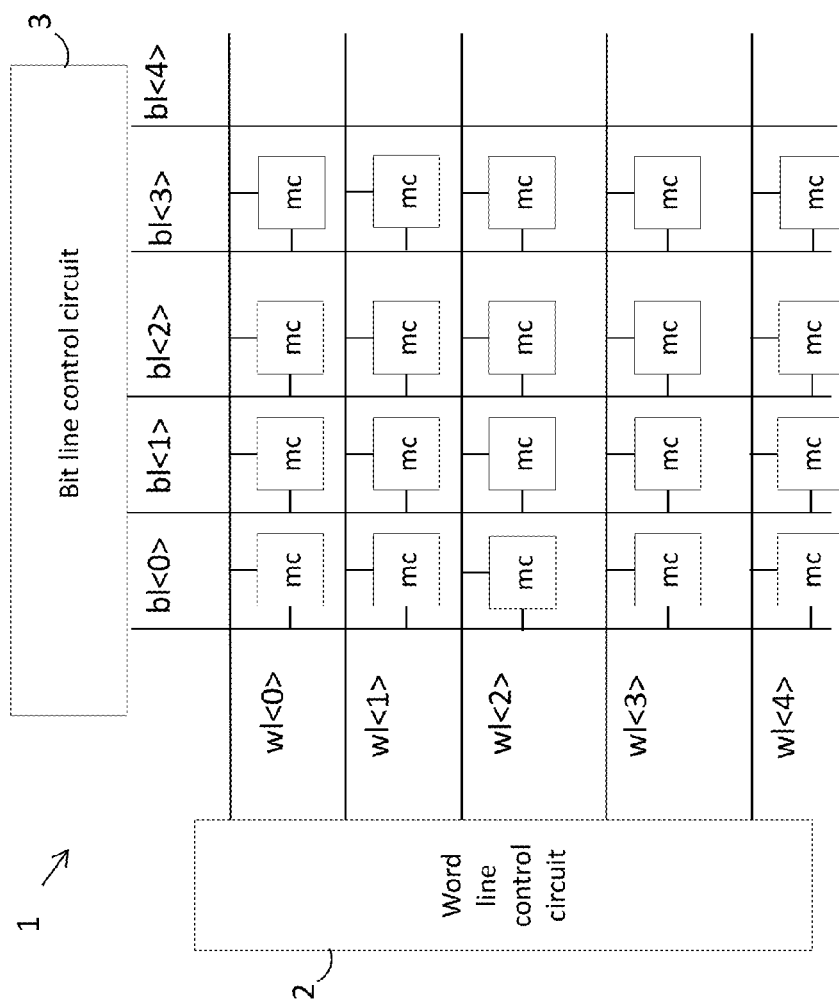
FIG. 1 shows an example of a memory, according to some embodiments.

FIG. 1 shows a diagram of a memory 1, according to some embodiments. Memory 1 includes an array of memory cells me arranged in rows and columns. Each memory cell mc is connected to a word line wl (e.g., wl<0>, wl<1>, wl<2>, wl<3>, or wl<4>) and a bit line bl (e.g., bl<0>, bl<1>, bl<2>, bl<3>, or bl<4>). The word line control circuit 2 and bit line control circuit 3 address selected memory cell(s) of the array by selecting a corresponding word line and bit line. The word lines wl and bit lines bl control writing data into the memory cells me by applying suitable voltages to the word lines wl and bit lines bl. The word lines wl and bit lines bl also control reading data from the memory cells me by applying suitable voltages to the word lines wl and reading out the data through the bit lines bl. The memory cells me may be any suitable memory cells using any of a variety of technologies, examples of which include resistive random access memory (ReRAM), conductive bridge random access memory (CBRAM), phasechange memory (PCM), magnetoresistive random access memory (MRAM), spin RAM and flash memory, by way of example and not limitation. Examples of memory cell configurations include one-transistor (1 T), one-resistor (1R), one-transistor one-resistor (1T1R) and one-drain one-resistor (1D1R), by way of example and not limitation.

Figure 2A:
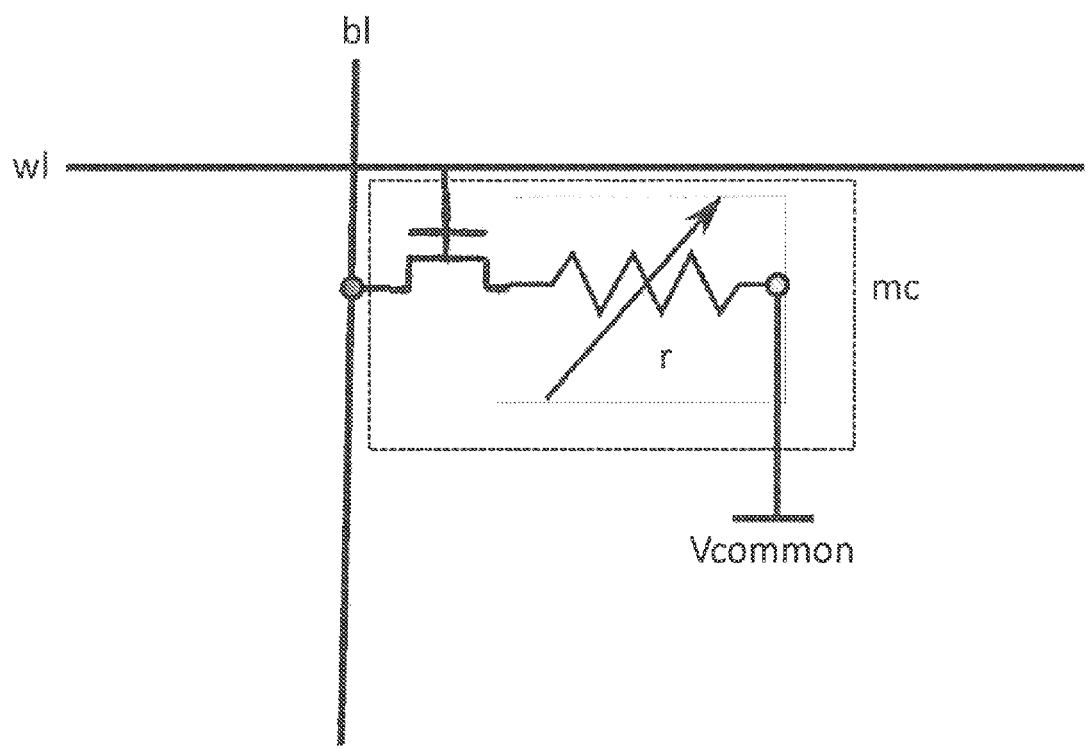
FIG. 2A shows an example of a memory cell, according to some embodiments.

FIG. 2A shows a diagram of an exemplary memory cell mc having a 1T1R configuration, according to some embodiments. As shown in FIG. 2A, memory cell mc has a transistor t and a resistive element r. In the example of FIG. 2A, the transistor t is an access transistor that controls access to the memory cell mc. Any suitable type of transistor may be used, such as a field effect transistor (FET) or a bipolar transistor, by way of example. Transistor t has a first terminal connected to a bit line bl, a second terminal connected to a first terminal of the resistive element r and a control terminal connected to the word line wl. The second terminal of the resistive element r is connected to a common voltage node Vcommon. In this example, memory cell mc is a three-terminal device connected to the bit line bl, word line wl and common voltage node Vcommon.

Figure 2B:
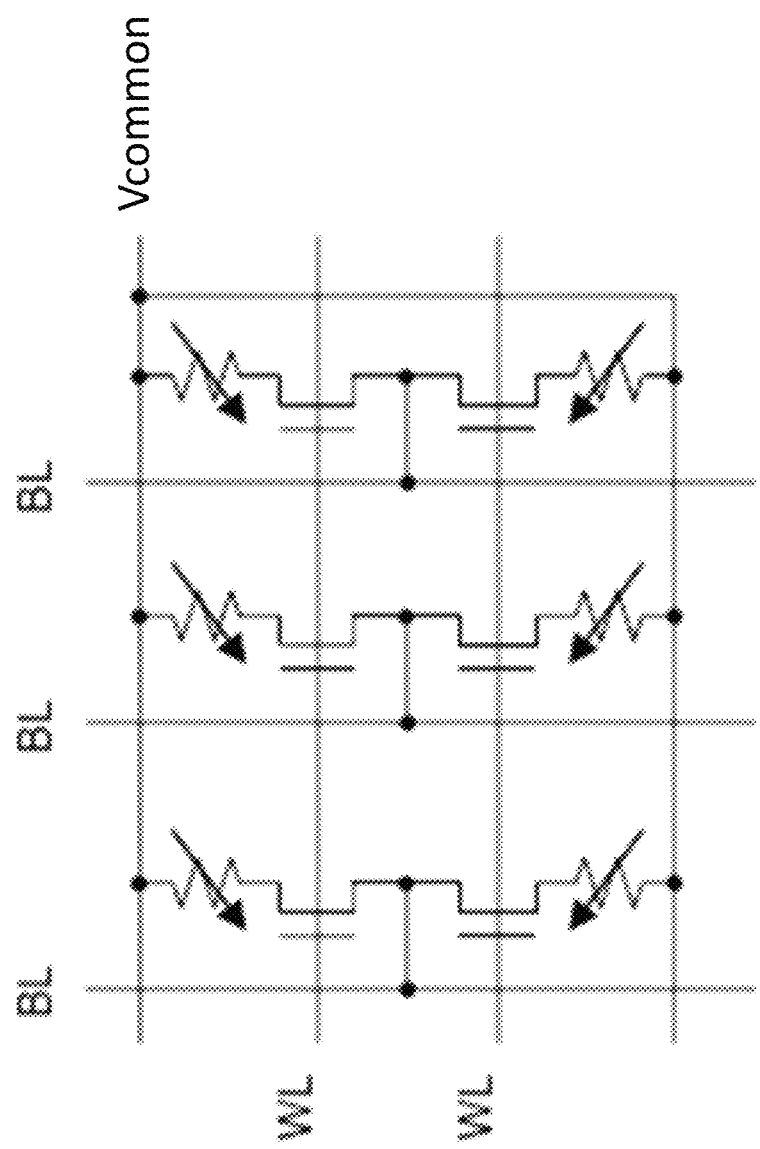
FIG. 2B shows a plurality of memory cells connected to a common voltage node, according to some embodiments.

FIG. 2B shows a configuration of a memory, according to some embodiments, in which a common voltage node Vcommon, also termed "plate," is connected to a plurality of memory cells. In the example of FIG. 2B, memory cells adjacent to one another within a column of the memory share a connection to the corresponding bit line bl.

In some types of non-volatile memory, such as conductive bridge random access memory (CBRAM), for example, data can be written into a memory cell by applying a current through the resistive element r of the memory cell mc. When a voltage is applied across the memory cell between the bit line bl and the common voltage node Vcommon, the current through the resistive element r can be controlled by controlling the voltage applied to the control terminal of the transistor t by the word line wl, as the current will be determined by V=IR, such that I=(Vbl−Vcommon)/(Rt+Rr), where Rt is the access resistance of the transistor and Rr is the resistance of the memory element r.

Applying a determined level of current through the memory cell with a determined polarity can "set" or "reset" the memory cell by causing a change in the resistance of the resistive element r. A "set" operation may cause the memory cell mc to store a data bit (e.g., 0 or 1) of a first polarity and a "reset" operation may cause the memory cell to store a data bit of a second (e.g., opposite) polarity. In some embodiments, a "set" or "reset" operation may be performed in a plurality of memory cells at the same time.

Figure 3:
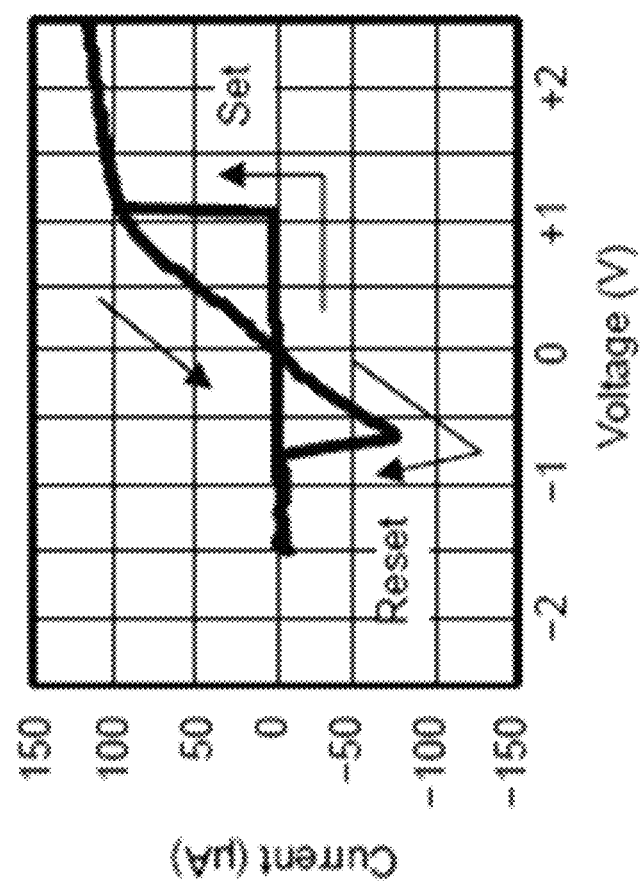
FIG. 3 shows an exemplary I-V curve for a memory cell of a CBRAM, according to some embodiments.

FIG. 3 shows an I-V curve of a CBRAM memory cell, according to some embodiments, where the current (I) is shown in units of micro amps, and the voltage (V) is shown in units of volts. As illustrated in FIG. 3, the memory cell may be "set" and "reset" by applying a current with the magnitudes and polarities as shown in FIG. 3, by way of example. The "set" operation may cause migration of conductive material that creates a conductive bridge within the CBRAM memory cell, thereby decreasing its resistance and storing a bit of a first polarity. The "reset" operation causes migration of the conductive material in the opposite direction, thereby removing the conductive bridge and increasing the resistance of the memory cell to store a bit of a second polarity. Although FIG. 3 shows an example of applying a current to a CBRAM memory cell, the techniques described herein are not limited to CBRAM. As mentioned above, the techniques described herein may be applied to other types of memory, including other types of nonvolatile memory.

Although the bit lines bl and word lines wl may be formed of conductive material (e.g. a metal), they have a non-zero impedance that depends on the length of the line between the selected memory cell and the control circuit. Thus, the impedance seen by the word line control circuit 2 or bit line control circuit 3 may depend on the address of the memory cell mc, as it the address may reflect the physical position of the memory cell. For example, the impedance of the bit line bl between the bit line control circuit 3 and the memory cell mc depends upon the distance of the memory cell from the bl control circuit, and the word line address of the memory cell mc is indicative of the distance between the memory cell mc and the bit line control circuit 3. The bit line voltage at memory cells connected to different word lines of a column may be different depending on the word line address of the memory cell. As illustrated in FIG. 1, a memory cell with a lower word line address (e.g., wl<0>) may be positioned closer to the bit line control circuit 3 compared to a memory cell with a higher word line address (e.g., wl<4>). In this example, a memory cell at a higher word line address will have a higher impedance between the memory cell and the bit line control circuit 3 than a memory cell that has at a lower word line address. Due to the non-zero impedance of the bit line, the voltage applied by the bit line control circuit 3 drops along the length of the bit line, such that a memory cell with a higher word line address sees a lower bit line voltage than that seen by a memory cell with a lower word line address. The change in the voltage of the bit line at different word line addresses affects the current that is applied to the memory cells, as shown in FIG. 2A, as the current through the memory cell is proportional to the difference between the bit line voltage and Vcommon. Thus, even though the same voltages may be applied to different bit lines and word lines by the control ciruits 2, 3, the current provided to memory cells at different word line addresses will be different due to the drop in the bit line voltage versus position, unless compensation is performed.

As illustrated in FIG. 2A, the current through a memory cell can be adjusted by the voltage that is applied to the control terminal of transistor t, as doing so changes the resistance of the memory cell. The voltage applied to the word line wl can be selected to compensate for the change in the voltage of the bit line at different word line addresses. In such an "address compensation" technique, the word line control circuit 2 may apply different voltages to different word lines depending on their word line addresses, such that memory cells connected to different word lines will receive substantially the same current during an operation such as a "set" or "reset" operation. However, such an address compensation technique may be complex or ineffective if a word line is defective and needs to be replaced with a replacement word line, as the replacement word line may be located at a different position that receives a different bit line voltage due to the change in bit line voltage at different positions.

A memory may include replacement word lines that can replace one or more defective word lines. If the replacement word lines are located at the edge of the memory, a problem can arise with the above-described address compensation technique when a defective word line is replaced with one of the replacement word lines. Since the replacement word line is located at a different physical location of the memory than the location of defective word line, the impedance of the bit line from the addressed memory cell to the bit line control circuit 3 will change when the defective word line is replaced with the replacement word line. If the replacement word line is located at the edge of the memory, the bit line voltage received by the replacement word line may be significantly different from that received by a word line that needs to be replaced located in the middle of the memory, for example. Thus, the current applied to memory cells connected to the replacement word line during a "set" or "reset" operation will be different from the current desired to be applied.

Figure 4:
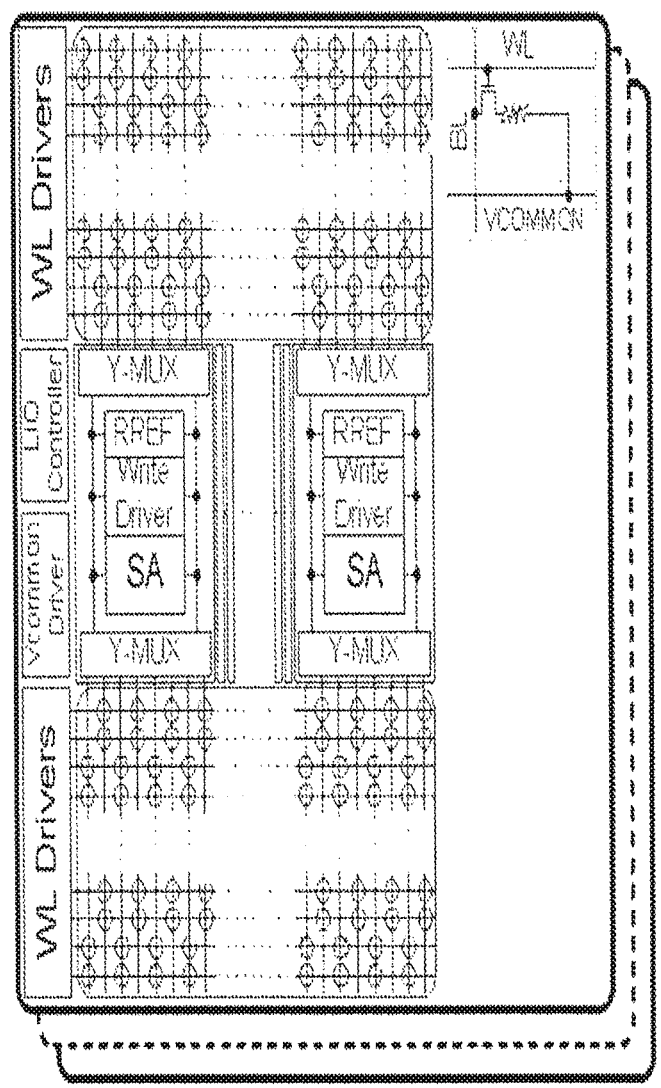
FIG. 4 shows an example of a memory including a plurality of tiles, according to some embodiments.

The word line control circuit 2 may be designed to compensate for the change in location of the word line when a defective word line is replaced. However, doing so may result in additional complexity for the word line control circuit 2, which may not be feasible. As illustrated in FIG. 4, a memory may have a plurality of "tiles." A first word line control circuit 2 may drive word lines for one or more tiles, while another word line control circuit 2 may drive the word lines for other tile(s). By way of example, a tile may include about 1000 word lines wl. However, the techniques described herein are not limited as to a particular number of word lines in a tile. In a memory that includes 16 tiles, there may be a word line control circuit to control 4 tiles, for example, and the memory may include four word line control circuits to control the 16 tiles. In some embodiments, the memory may include a single voltage generation circuit to generate different voltages to be applied to respective word lines by the word line control circuits 2. Replacement of defective word lines may be performed for individual tiles or groups of tiles. If a first word line control circuit 2 replaces a defective word line for one tile or group of tiles, the same word line may not be replaced in another tile or group of tiles. To compensate for the change in bit line voltage at the position of a replacement word line, the word line control circuit 2 may need to track the tile(s) in which the word line has been replaced, and generate a suitable word line voltage for the replaced word line in the tile(s) in which has been replaced, as well as generate another voltage for the word line in tile(s) where it has not been replaced. As mentioned above, such a compensation technique may not be feasible or may lead to undesirable complexity and/or size of the word line control circuit(s) and/or voltage generators.

In some embodiments of the techniques described herein, a memory may include a plurality of replacement word lines that are interspersed throughout the memory between the word lines. If a word line is defective and needs to be replaced, in can be replaced with a nearby replacement word line. The replacement word lines can be positioned at intervals throughout the array such that a defective word line can be replaced with a replacement word line that is located in a position not significantly different from that of the defective word line. Since the position of the replacement word line is not significantly different from that of the defective word line, the impedance of the bit line to reach the memory cell does not change significantly when the word line is replaced, and the bit line voltage of the replacement word line is not significantly different from that of the word line that has been replaced. As a result, the current provided to the memory cells connected to the replacement word line during an operation such as a "set" or "reset" operation does not change significantly with respect to the current that would have been provided to the defective word line. Accordingly, in some embodiments the address compensation technique does not need to be changed when a defective word line is replaced with a nearby replacement word line.

Figure 5:
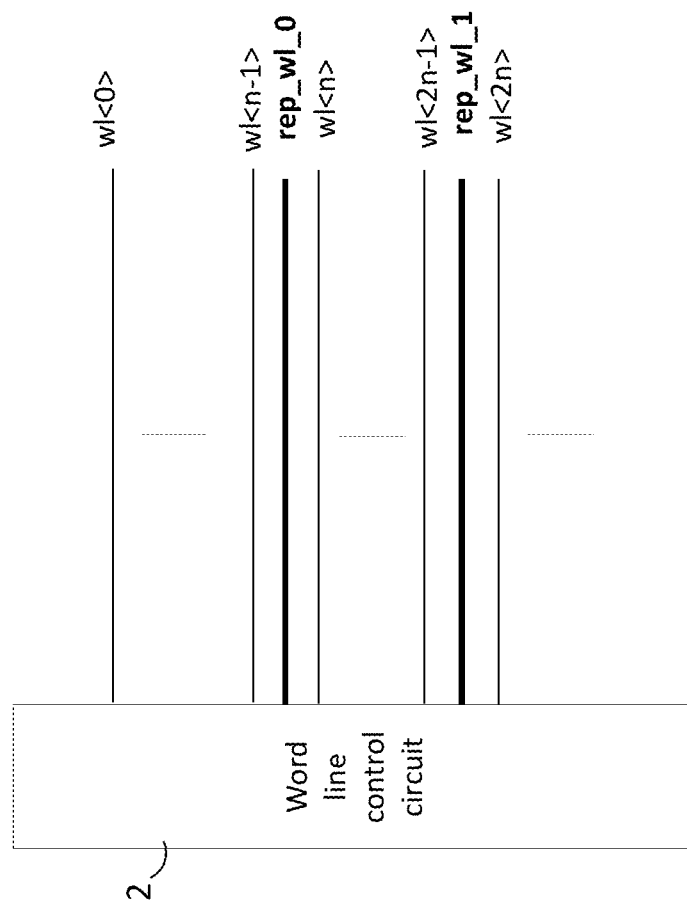
FIG. 5 shows an example of a memory having replacement word lines interspersed among the word lines, according to some embodiments.

FIG. 5 shows an embodiment of a memory in which replacement word lines are interspersed throughout the memory between the original word lines. As shown in FIG. 5, a word line control circuit 2 is connected to a plurality of word lines wl<0> to wl<n-1>, wl<n> to wl<2n-1>, etc. Between word lines wl<n-1> and wl<n> is a replacement word line rep_wl_0. Between word lines wl<2n-1> and wl<2n> is another replacement word line rep_wl_1. Any number of word lines and replacement word lines may be included. Each replacement word line may be connected to a corresponding row of memory cells, as illustrated in FIG. 1, so that the memory cells connected to a defective word line can be replaced with the memory cells connected to the replacement word line. In some embodiments, such replacement may be performed by the word line control circuit 2 when the word line control circuit 2 determines that a word line is defective and needs to be replaced.

In some embodiments, defective word line(s) may be replaced as follows. In the event that a word line from wl<0> to wl<n-1> is defective, it may be replaced with replacement word line rep_wl_0. In the event that a word line from wl<n> to wl<2n-1> is defective, it may be replaced with replacement word line rep_wl_1. In the context of FIG. 5, a defective word line may be replaced with a replacement word line located above or below the defective word line, as the techniques described herein are not limited in this respect. For example, in some embodiments a defective word line from wl<n> to wl<2n-1> may be replaced with replacement word line rep_wl_0, located above word lines wl<n> through wl<2n-1> in FIG. 5.

In some embodiments, replacement word lines may be interspersed throughout the memory. A replacement word line may be positioned at regular intervals (e.g., every n word lines), such that a replacement word line is positioned between successive groups of n word lines. Any suitable value of n may be used, such as 64, 128, or any other suitable value. In some embodiments, the number of word lines n between replacement word lines may be selected such that a defective word line can be replaced by a replacement word line that is located close enough to the defective word line such that the difference in the voltage of the bit line bl between the defective word line and the replacement word line is below a predetermined threshold. Accordingly, if a word line is defective, it can be replaced with a nearby replacement word line, and since the change in bit line voltage is below the threshold the word line control circuit 2 need not adjust the voltage of the word line to compensate for the change in position of the word line when it is replaced. The predetermined threshold may be determined based on a predetermined threshold current difference that is determined to be acceptable based on the type of memory cell and/or the configuration of the memory, for example.

Figure 6:
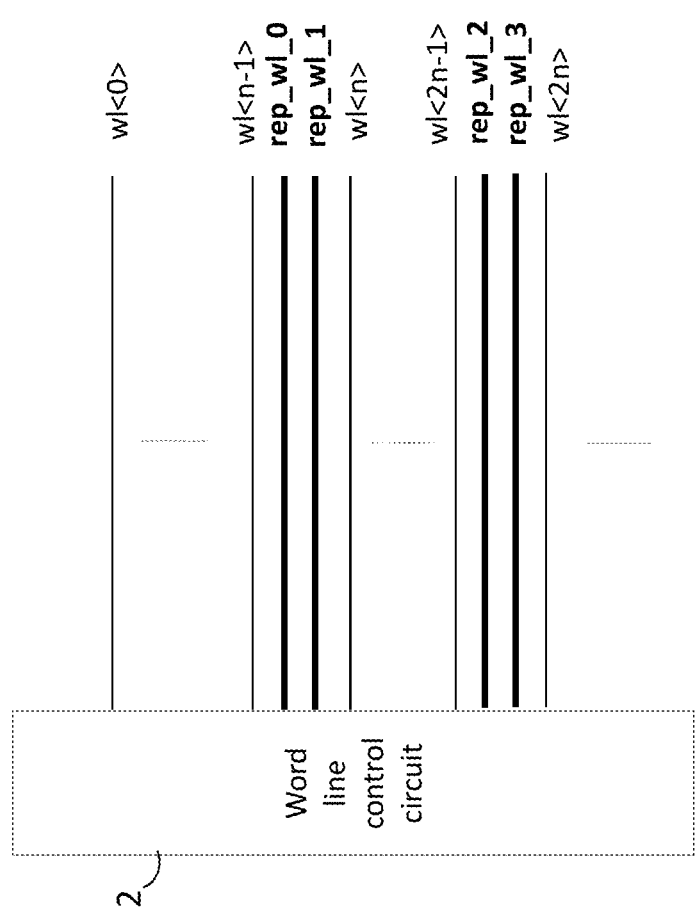
FIG. 6 shows an example of a memory having a plurality of replacement word lines between groups of word lines, according to some embodiments.

FIG. 6 shows an embodiment of a memory in which a plurality of replacement word lines are included between successive groups of n word lines. Including a plurality of replacement word lines between successive groups of word lines may allow replacing a plurality of word lines near the plurality of replacement word lines. For example, in the event that a first word line from wl<0> to wl<n-1> is defective, it may be replaced with replacement word line rep_wl_0. In the event that a second word line from wl<0> to wl<n-1> is defective, it may be replaced with replacement word line rep_wl_1. In the event that a first word line from wl<n> to wl<2n-1> is defective, it may be replaced with replacement word line rep_wl_2. In the event that a second word line from wl<n> to wl<2n-1> is defective, it may be replaced with replacement word line rep_wl_3. In the context of FIG. 6, a defective word line may be replaced with a replacement word line located above or below the defective word line, as the techniques described herein are not limited in this respect. For example, in some embodiments a defective word line from wl<n> to wl<2n-1> may be replaced with replacement word line rep_wl_0 or rep_wl_1, located above word lines wl<n> to wl<2n-1> in FIG. 6.

Word line control circuit 2 and bit line control circuit 3 may include any suitable circuitry, as will be appreciated by those of ordinary skill in the art. In some embodiments, as illustrated in FIG. 4, the word line control circuit 2 may include circuitry termed "WL Drivers." As further illustrated in FIG. 4, the bit line control circuit 3 may include one or more write drivers for applying suitable bit line voltages, one or more sense amplifiers SA for reading data from the memory cells, one or more multiplexers Y-MUX for selecting bit lines, and one or more reference resistances RREF. The memory may include a V common driver for applying a suitable voltage Vcommon to the common voltage node. The memory may include a LIO controller, as also illustrated in FIG. 4. In addition the memory or bit cells may be provided in one or more arrays, as illustrated in FIG. 4. However, the techniques described herein are not limited as to the memory configuration or memory size illustrated in FIG. 4, as any suitable memory configuration or size may be used.

The techniques and apparatus described herein are not limited in its application to the details of construction and the arrangement of components set forth in the foregoing description or illustrated in the drawings. The techniques and apparatus described herein are capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A memory, comprising:
    a plurality of memory cells;
    a plurality of bit lines connected to the plurality of memory cells;
    a plurality of word lines connected to the plurality of memory cells;
    a plurality of replacement word lines connected to the plurality of memory cells and interspersed among the plurality of word lines; and
    a word line control circuit configured to apply different voltages to respective word lines of the plurality of word lines based on positions of the respective word lines, the word line control circuit being configured to apply the different voltages to the respective word lines during an operation performed on memory cells of the plurality of memory cells such that the memory cells connected to the respective word lines receive substantially the same current during the operation, the memory cells being connected to the respective word lines, wherein the word line control circuit is configured to replace a defective word line of the plurality of word lines with a replacement word line of the plurality of replacement word lines,
    wherein the word line control circuit is configured to replace the defective word line without compensating one of the different voltages applied to the replacement word line during the operation based upon a position of the replacement word line.

2. The memory of claim 1, wherein the word line control circuit is configured to apply a same voltage to the replacement word line during the operation as the word line control circuit is configured to apply to the defective word line during the operation.

3. The memory of claim 1, wherein the operation is an operation of writing data to the memory cells of the plurality of memory cells.

4. The memory of claim 3, wherein the operation of writing data comprises a set operation in which current is applied to a memory cell in a first direction or a reset operation in which current is applied to the memory cell in a second direction.

5. The memory of claim 1, wherein
    the plurality of word lines includes a first set of word lines, a second set of word lines and a third set of word lines,
    the plurality of replacement word lines includes at least one first replacement word line between the first set of word lines and the second set of word lines, and at least one second replacement word line between the second set of word lines and the third set of word lines,
    the word line control circuit is configured to replace a defective word line of the first set or the second set with a first replacement word line of the at least one first replacement word line, and
    the word line control circuit is configured to replace a defective word line of the second set or the third set with a second replacement word line of the at least one second replacement word line.

6. The memory of claim 5, wherein the at least one first replacement word line comprises at least two replacement word lines.

7. The memory of claim 1, wherein an individual memory cell of the plurality of memory cells includes a transistor and a memory element.

8. The memory of claim 7, wherein the word line control circuit is configured to apply a current to the memory element to store a bit value by changing a resistance of the memory element.

9. The memory of claim 7, wherein the transistor has a control terminal connected to a word line of the plurality of word lines and the transistor has a second terminal connected to a bit line of the plurality of bit lines.

10. The memory of claim 9, wherein the transistor has a third terminal connected to the memory element and the memory element is also connected to a common voltage node.

11. The memory of claim 1, wherein the memory is a non-volatile memory.

12. The memory of claim 1, wherein the memory comprises at least one of a resistive random access memory (ReRAM), conductive bridge random access memory (CBRAM), phase-change memory (PCM), magnetoresistive random access memory (MRAM), spin RAM or flash memory.

13. The memory of claim 1, wherein replacement word lines of the plurality of replacement word lines are interspersed among the plurality of word lines throughout the memory.

14. A method of operating a memory that includes a plurality of memory cells, a plurality of bit lines connected to the plurality of memory cells, a plurality of word lines connected to the plurality of memory cells, a plurality of replacement word lines connected to the plurality of memory cells and interspersed among the plurality of word lines, and a word line control circuit, the method comprising:

applying, by the word line control circuit, different voltages to respective word lines of the plurality of word lines based on positions of the respective word lines during an operation performed on memory cells of the plurality of memory cells such that the memory cells connected to the respective word lines receive substantially the same current during the operation, the memory cells being connected to the respective word lines; and replacing a defective word line of the plurality of word lines with a replacement word line of the plurality of replacement word lines, wherein the defective word line is replaced without compensating one of the different voltages applied to the replacement word line during the operation based upon a position of the replacement word line.

15. A memory, comprising:

a plurality of memory cells;

a plurality of bit lines connected to the plurality of memory cells;

a plurality of word lines connected to the plurality of memory cells, the plurality of word lines including a first set of word lines, a second set of word lines and a third set of word lines;

a plurality of replacement word lines connected to the plurality of memory cells and including at least one first replacement word line between the first set of word lines and the second set of word lines, and at least one second replacement word line between the second set of word lines and the third set of word lines; and a word line control circuit configured to apply different voltages to respective word lines of the plurality of word lines based on positions of the respective word lines, the word line control circuit being configured to apply the different voltages to the respective word lines during an operation performed on memory cells of the plurality of memory cells such that the memory cells connected to the respective word lines receive substantially the same current during the operation, the memory cells being connected to the respective word lines, wherein the word line control circuit is configured to replace a defective word line of the first set or the second set with a replacement word line of the at least one first replacement word line, wherein the word line control circuit is configured to replace the defective word line without compensating one of the different voltages applied to the replacement word line during the operation based upon a position of the replacement word line.

16. The memory of claim 15, wherein the word line control circuit is configured to apply a same voltage to the replacement word line during the operation as the word line control circuit is configured to apply to the defective word line during the operation.

17. The memory of claim 15, wherein the operation is an operation of writing data to the memory cells of the plurality of memory cells.

* * * * *